(12) United States Patent
Marsh

(10) Patent No.: US 7,365,028 B2
(45) Date of Patent: Apr. 29, 2008

(54) METHODS OF FORMING METAL OXIDE AND SEMIMETAL OXIDE

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 385 days.

(21) Appl. No.: 11/233,967

(22) Filed: Sep. 23, 2005

(65) Prior Publication Data

US 2006/0024881 A1 Feb. 2, 2006

Related U.S. Application Data

(63) Continuation of application No. 10/910,219, filed on Aug. 2, 2004, now Pat. No. 7,208,412.

(51) Int. Cl.
*H01L 21/44* (2006.01)

(52) U.S. Cl. ............... 438/785; 438/765; 438/770; 438/775; 257/E21.101

(58) Field of Classification Search ............... 438/765, 438/770, 774, 775, 785; 257/E21.101
See application file for complete search history.

(56) References Cited

U.S. PATENT DOCUMENTS

| 5,389,401 | A | * | 2/1995 | Gordon | ............... 427/255.36 |
| 6,960,537 | B2 | | 11/2005 | Shero et al. | |
| 2004/0043600 | A1 | | 3/2004 | Vaartstra | |

* cited by examiner

*Primary Examiner*—Quoc Hoang
(74) *Attorney, Agent, or Firm*—Wells St. John P.S.

(57) ABSTRACT

The invention includes methods of forming metal oxide and/or semimetal oxide. The invention can include formation of at least one metal-and-halogen-containing material and/or at least one semimetal-and-halogen-containing material over a semiconductor substrate surface. The material can be subjected to aminolysis followed by oxidation to convert the material to metal oxide and/or semimetal oxide. The aminolysis and oxidation can be separate ALD steps relative to one another, or can be conducted in a reaction chamber in a common processing step.

25 Claims, 4 Drawing Sheets

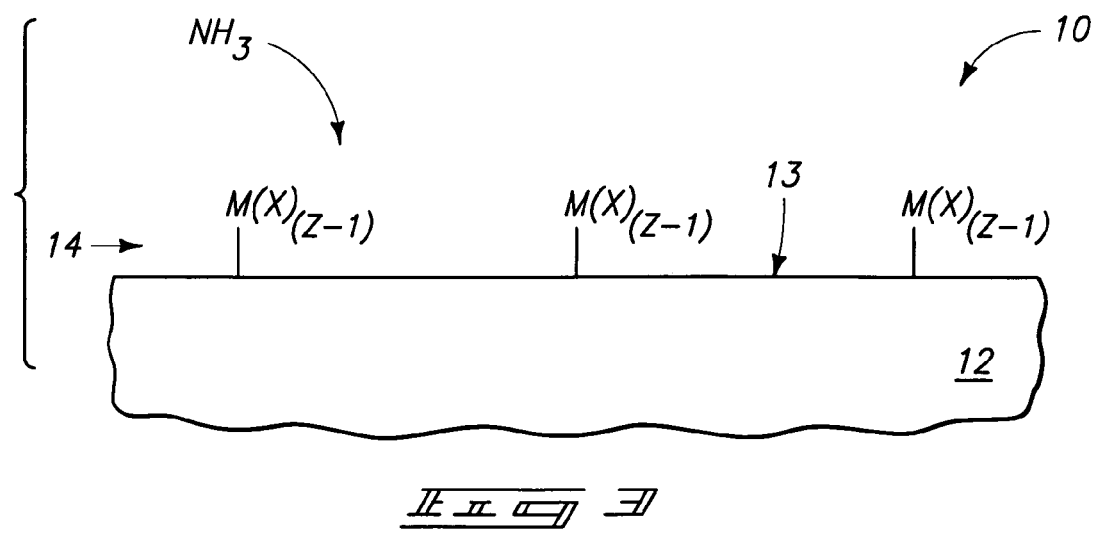
_FIG. 3_
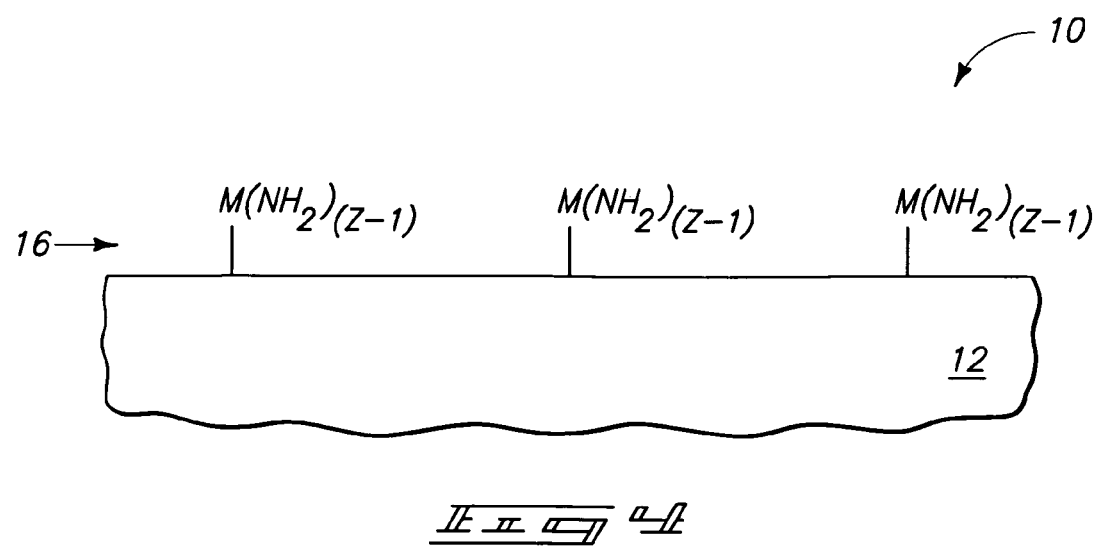
_FIG. 4_

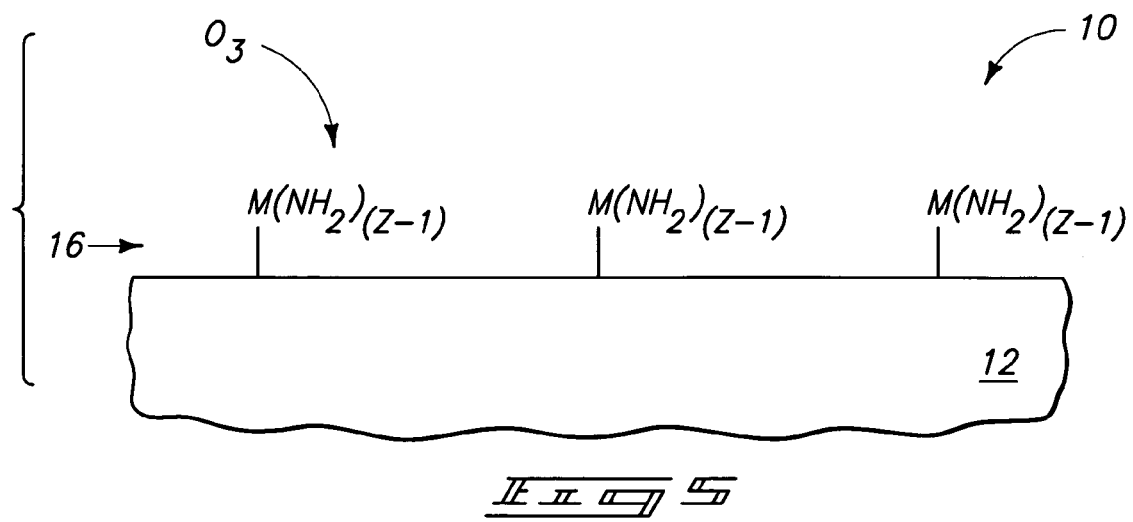
F I G 5
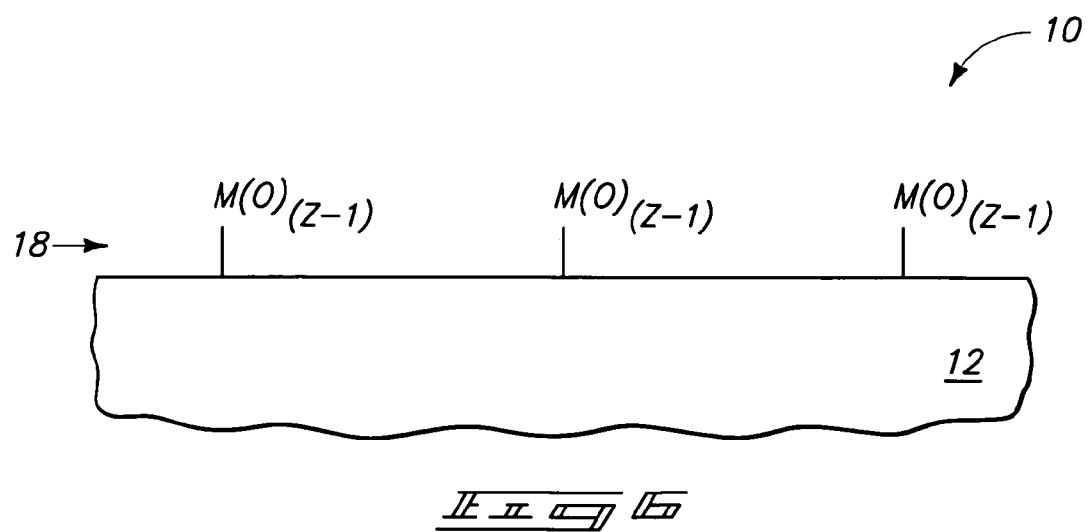
F I G 6

METHODS OF FORMING METAL OXIDE AND SEMIMETAL OXIDE

RELATED PATENT DATA

This patent resulted from a continuation of U.S. patent application Ser. No. 10/910,219, filed Aug. 2, 2004, which issued Apr. 24, 2007 a U.S. Pat. No. 7,208,412, and which is hereby incorporated by reference.

TECHNICAL FIELD

The invention pertains to methods of forming metal oxide and semimetal oxide.

BACKGROUND OF THE INVENTION

Metal oxides and semimetal oxides are commonly incorporated into semiconductor constructions. For instance, metal oxides and semimetal oxides can be utilized as dielectric materials in capacitor structures, and can be utilized as dielectric materials in other types of semiconductor devices.

One of the methods that has been developed for forming metal oxide materials and semimetal oxide materials involves the utilization of a metal chloride precursor (such as, for example, hafnium chloride, titanium chloride, zirconium chloride, etc.) or semimetal chloride precursor (such as, for example, silicon chloride) to form a metal-chloride-containing layer or semimetal-chloride-containing layer over a substrate surface. The metal-chloride-containing layer or semimetal-chloride-containing layer is then exposed to water to convert the metal chloride or semimetal chloride to metal oxide or semimetal oxide.

The formation of the metal-chloride-containing layer (or semimetal-chloride-containing layer) and conversion of the metal-chloride-containing layer (or semimetal-chloride-containing layer) to metal oxide (or semimetal oxide) can be accomplished by either atomic layer deposition (ALD) processes or chemical vapor deposition (CVD) processes.

ALD technology typically involves formation of successive atomic layers on a substrate. Such layers may comprise, for example, an epitaxial, polycrystalline, and/or amorphous material. ALD may also be referred to as atomic layer epitaxy, atomic layer processing, etc.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. It is noted that one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render deposition which is not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. It is further noted that local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate. Accordingly, observation indicates that chemisorption might not occur appreciably on portions of a substrate though it occurs at a suitable rate on other portions of the same substrate. Such a condition may introduce intolerable defects into a deposited material.

Regardless of whether ALD, CVD or a combination of ALD and CVD is utilized to form metal oxide or semimetal oxide, there can be difficulties associated with the metal oxide or semimetal oxide formation. One of the problems with conventional processes for forming metal oxide and semimetal oxide is that the processes frequently involve utilization of water as a reactant. The amounts of water utilized in such deposition processes can cause incorporation of OH groups in deposited films which degrade electrical performance of dielectric materials. In addition, water can be extremely difficult to remove from within a vacuum chamber. Water within a vacuum chamber can cause unwanted side reactions (such as corrosion) relative to semiconductor structures associated with a substrate exposed to the water, and relative to the interior regions of a reaction chamber. In light of the above-discussed problems, it is desired to develop new methods for formation of metal oxides and semimetal oxides.

Although the invention was motivated, at least in part, by a desire to alleviate the above-discussed problems associated with utilization of water in deposition processes, it is to be understood that the invention is not limited to such aspects.

SUMMARY OF THE INVENTION

In one aspect, the invention encompasses a method of forming a metal oxide in which at least one metal-and-halogen-containing material is formed over a semiconductor substrate surface and subjected to aminolysis followed by oxidation to convert the material to metal oxide. In a similar aspect, the invention encompasses a method of forming a semimetal oxide in which at least one semimetal-and-halogen-containing material is formed over a semiconductor substrate surface and subjected to aminolysis followed by oxidation to convert the material to the semimetal oxide. The semimetal can be, for example, silicon.

In one aspect, the invention encompasses another method of forming metal oxide. A semiconductor substrate surface is exposed to one or more compounds comprising metal and halogen to form a construction comprising at least one metal-and-halogen-containing material bonded to the substrate surface. The construction is exposed to reactive nitrogen to replace at least some of the halogen of the metal-and-halogen-containing material with the nitrogen, and to thereby convert at least some of the metal-and-halogen-containing material to metal-and-nitrogen-containing material. The metal-and-nitrogen-containing material is exposed to an oxidant other than water to convert at least some of the metal-and-nitrogen-containing material to metal oxide. A similar aspect can be accomplished with a semimetal in place of the metal.

In one aspect, the invention encompasses yet another method of forming metal oxide. A semiconductor substrate is provided, and such substrate has a surface comprising bonding atoms. The bonding atoms are oxygen and/or nitrogen. At least one iteration of the following sequence is performed. The bonding atoms are exposed to one or more compounds comprising metal and halogen to form a construction comprising at least one metal-and-halogen-containing composition bonded to the substrate through the bonding atoms; the construction is exposed to reactive nitrogen to replace at least some of the halogen of the metal-and-halogen-containing material with the nitrogen; and subsequently the material is exposed to an oxidant other than water to convert at least some of the material to metal oxide. A similar aspect can be accomplished with a semimetal in place of the metal.

BRIEF DESCRIPTION OF THE DRAWINGS

Preferred embodiments of the invention are described below with reference to the following accompanying drawings.

FIG. 3 is a view of the FIG. 1 wafer fragment shown at a processing stage subsequent to that of FIG. 2.

FIG. 4 is a view of the FIG. 1 wafer fragment shown at a processing stage subsequent to that of FIG. 3.

FIG. 5 is a view of the FIG. 1 wafer fragment shown at a processing stage subsequent to that of FIG. 4.

FIG. 6 is a view of the FIG. 1 wafer fragment shown at a processing stage subsequent to that of FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methods of forming metal oxide in which at least one metal-and-halogen-containing material is formed over a semiconductor substrate surface, and then subjected to aminolysis followed by oxidation to convert the material to metal oxide. One of the reasons that water is utilized as an oxidant in prior art processes of converting metal chloride to metal oxide is that the metal chloride cannot be readily oxidized with oxidants other than water. One aspect of the present invention is a recognition that metal chlorides which are susceptible to hydrolysis are often also susceptible to aminolysis. Thus, aminolysis can be utilized to convert the metal chlorides to metal amines, which can then be oxidized with non-water oxidants to form metal oxides. The invention also includes aspects in which semimetal materials are subjected to aminolysis followed by oxidation. An exemplary aspect of the invention is described with reference to FIGS. 1-6.

Figure 1:
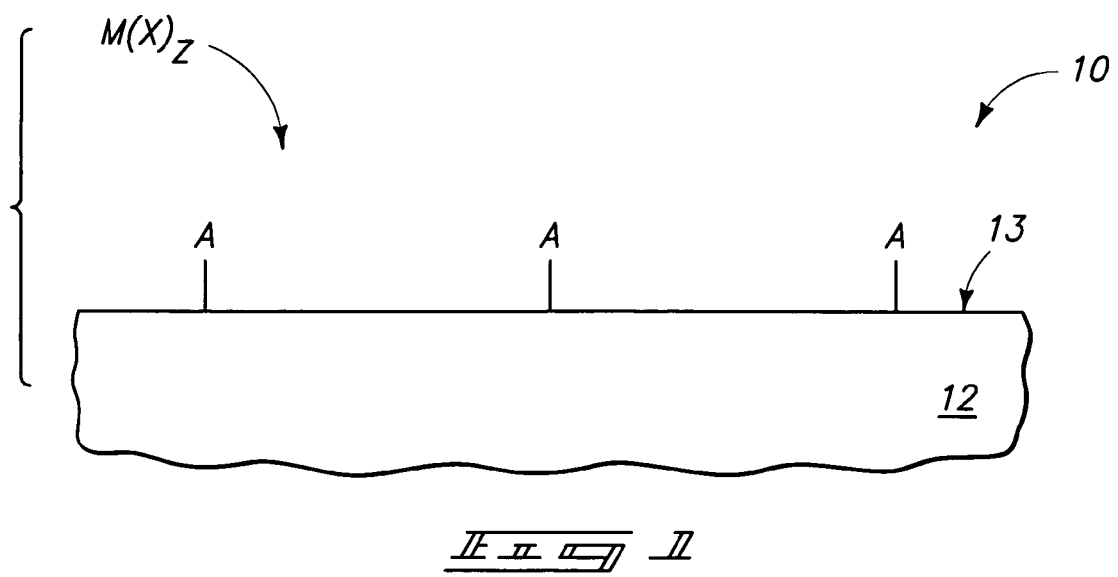
FIG. 1 is a diagrammatic, cross-sectional view of a fragment of a semiconductor construction at a preliminary processing step in accordance with an aspect of the present invention.

Referring initially to FIG. 1, a semiconductor construction 10 is illustrated at a preliminary processing step. The construction includes a semiconductor substrate 12, which can comprise, for example, a monocrystalline silicon wafer. Substrate 12 can be homogeneous in composition, or can comprise various layers and devices (not shown) associated therewith. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 has a surface 13, and such surface is shown to comprise bonding atoms "A". The bonding atoms can be, for example, either or both of oxygen and nitrogen. If the atoms are oxygen, they will typically be in the form of OH extending across at least a portion of substrate surface 13, and if the atoms are nitrogen they will typically be in the form of $NH_2$ extending across at least a portion of the surface 13. Accordingly, even though the single letter "A" is utilized to represent bonding atoms projecting from surface 13, it is to be understood that the bonding atoms can be part of molecular groups extending from the surface at the processing stage of FIG. 1.

The surface 13, and particularly the bonding atoms "A", is exposed to a compound comprising metal or semimetal, and halogen, with such compound being represented as $M(X)_z$ in FIG. 1. The metal or semimetal of the compound is represented by "M" and the halogen is represented by "X". The component "M" can be any suitable metal or semimetal, and in particular aspects will comprise hafnium, titanium, tungsten, germanium, silicon, niobium, tantalum, barium, vanadium, molybdenum, chromium or zirconium. The halogen can be any of the halogens, and in particular aspects will comprise chlorine. The number of halogens associated with the metal or semimetal in the shown compound is represented by "z". Typically, z would be an integer of from 4 to 6. Halogens within the compound $M(X)_z$ can all be the same as one another, or can be mixed, and can thus include one or more of fluorine, chlorine, bromine and iodine. For instance, the compound $M(X)_z$ can correspond to $TiCl_4$, $HfCl_4$, $TiCl_2Br_2$, $HfCl_2F_2$, $SiCl_4$, $WCl_6$, etc. Although the compound is illustrated to comprise only halogens as ligands around the metal, it is to be understood that the invention also includes aspects in which a compound comprises at least one halogen ligand, and at least one ligand which is not halogen. The one or more ligands which are not halogen can be an suitable ligands, including, for example, amides, alkyls, organic materials containing one or more cyclic groups, saturated organic materials, unsaturated organic materials, etc.

A downwardly-pointing arrow is provided in FIG. 1 on the right-hand side of the $M(X)_z$ to indicate that the $M(X)_z$ interacts with surface 13 of substrate 12.

Figure 2:
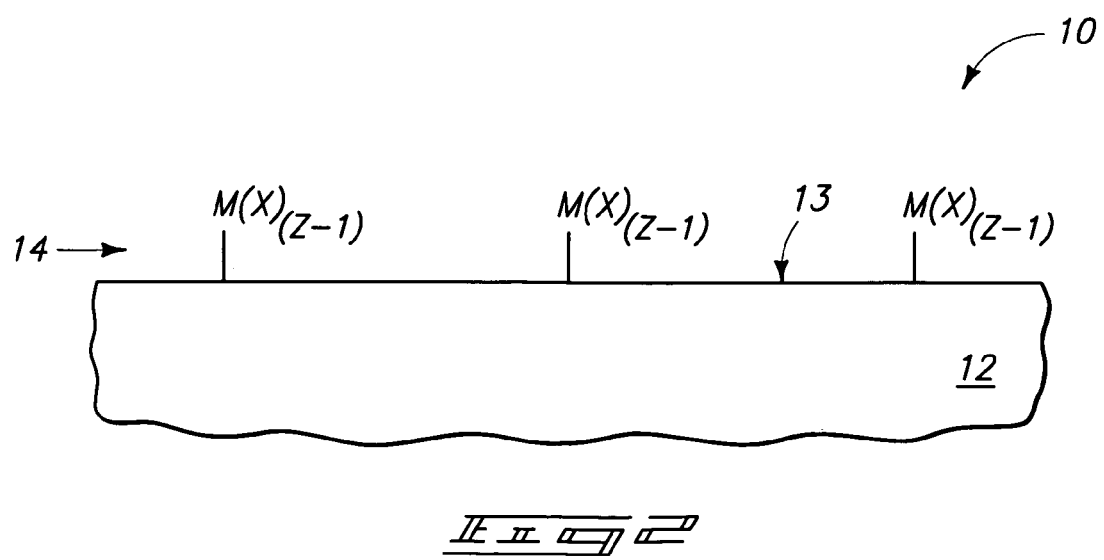
FIG. 2 is a view of the FIG. 1 wafer fragment shown at a processing stage subsequent to that of FIG. 1.

Referring next to FIG. 2, construction 10 is illustrated after the compound $M(X)_z$ has interacted with the bonding atoms associated with surface 13 to form a metal-and-halogen-containing material (or semimetal-and-halogen-containing material) 14 across the surface 13 of substrate 12. Such material is illustrated to comprise $M(X)_{(z-1)}$.

The shown reaction utilized to form the metal-and-halogen-containing material (or semimetal-and-halogen-containing material) 14 has displaced one of the halogens from the material $M(X)_z$ of FIG. 1 and thereby formed the material $M(X)_{(z-1)}$ bonded to surface 13 in FIG. 2. As will be understood by persons of ordinary skill in the art, such displacement would typically comprise formation of a bond between the metal, or semimetal, and the bonding atoms "A" (FIG. 1), which is not shown in FIG. 2.

The material 14 can comprise only a single type of metal or semimetal (for example, can comprise only hafnium) or can comprise a mixture of metals and/or semimetals depending on whether the reaction of FIG. 1 utilized only a single precursor $M(X)_z$, or utilized mixtures of metal-containing precursors and/or semimetal-containing precursors. In particular aspects, the material 14 comprises, consists essentially of, or consists of chlorine, iodine, fluorine and/or bromine together with one or more of barium, chromium, germanium, hafnium, molybdenum, niobium, silicon, tantalum, titanium, tungsten, vanadium, and zirconium. In such aspects, the precursor of FIG. 1 (i.e., the $M(X)_z$ of FIG. 1) can be, for example, primarily barium chloride, primarily chromium chloride, primarily germanium chloride, primarily hafnium chloride, primarily molybdenum chloride, primarily niobium chloride, primarily tantalum chloride, primarily titanium chloride, primarily vanadium chloride, primarily silicon chloride, primarily tungsten chloride or primarily zirconium chloride; and in some aspects can comprise, consist essentially of, or consist of one or more of barium chloride, chromium chloride, germanium chloride, hafnium chloride, molybdenum chloride, niobium chloride, tantalum chloride, titanium chloride, silicon chloride, tungsten chloride, vanadium chloride and zirconium chloride. The material 14 can, in some aspects, be referred to as a metal-and-halogen-containing layer, or semimetal-and-halogen-containing layer, formed over substrate 12.

Referring next to FIG. 3, the material 14 is exposed to reactive nitrogen. In the shown aspect of the invention, the reactive nitrogen is comprised by ammonia, but it is to be understood that any suitable nitrogen-containing composition can be used, including, for example, compositions in which the nitrogen is present as a primary amine or a secondary amine. Primary and secondary amines have one bond or two bonds, respectively, to organic groups as is known to persons of ordinary skill in the art. The nitrogen is ultimately utilized for aminolysis to displace at least some of the halogen of material 14, and in typical aspects of the invention to displace substantially all, or even entirely all, of the halogen from material 14 and replace the halogen with nitrogen-containing groups.

FIG. 4 shows the construction 10 after the aminolysis has replaced the halogens of material 14 (FIG. 3) with nitrogen-containing groups to convert the material 14 into a metal-and-nitrogen-containing material, or semimetal-and-nitrogen-containing material, 16. In the shown aspect of the invention, all of the metal-and-halogen-containing material (or semimetal-and-halogen-containing material) 14 has been converted to metal-and-nitrogen-containing material (or semimetal-and-nitrogen-containing material) 16. Generally, at least some of the metal-and-halogen-containing material (or semimetal-and-halogen-containing material) 14 will be converted to the metal-and-nitrogen-containing material (or semimetal-and-nitrogen-containing material) 16, and it can be preferable that substantially all, or entirely all, of the metal-and-halogen-containing material (or semimetal-andhalogen-containing material) 14 be converted to the metal-and-nitrogen-containing material (or semimetal-and-nitrogen-containing material) 16.

The nitrogen-containing precursor of FIG. 3 can be a single precursor, or can be a mixture of precursors. Accordingly, the metal-and-nitrogen-containing material (or semimetal-and-nitrogen-containing material) 16 of FIG. 4 can have a single type of nitrogen-containing group therein, or can have mixtures of nitrogen-containing groups. In particular aspects, substantially all of the nitrogen-containing precursor of FIG. 3 will be ammonia, a primary amine, or a secondary amine; and in such aspects substantially all of the nitrogen compound of the material 16 of FIG. 4 will be a derivative of ammonia, a derivative of a primary amine, or a derivative of a secondary amine. The term "substantially all" is utilized to indicate that a large majority of a described substance is a designated composition, which includes, but is not limited to, aspects in which there is no detectable portion of the described substance except the designated composition. For instance, if "substantially all" of the nitrogen-containing precursor of FIG. 3 is ammonia, the large majority of such precursor will be ammonia, which includes, but is not limited to, aspects in which the only detectable nitrogen-containing precursor within a reaction chamber is ammonia, and which also includes, but is not limited to, aspects in which an entirety of the nitrogen-containing precursor within a reaction chamber is ammonia.

Referring next to FIG. 5, the metal-and-nitrogen-containing material (or semimetal-and-nitrogen-containing material) 16 is exposed to an oxidant. The shown oxidant is $O_3$, but it is to be understood that any suitable oxidant can be utilized. Preferably, the oxidant will not include water. In particular aspects, the oxidant is selected from the group consisting of $O_2$, $O_3$, $NO_x$, $N_2O$ and mixtures thereof, where x is a number greater than 0. Thus, the oxidant can comprise, consist essentially of, or consist of one or more of $O_2$, $O_3$, $NO_x$ and $N_2O$. The oxidant is utilized to oxidize the metal-and-nitrogen-containing material (or semimetal-and-nitrogen-containing material) 16, and to thereby convert at least some of the material 16, and typically an entirety of the material 16, to metal oxide (or semimetal oxide).

FIG. 6 shows construction 10 after the material 16 (FIG. 5) has been converted to a metal oxide (or a semimetal oxide) 18. Such oxide is shown as $M(O)_{(z-1)}$ in the exemplary application of FIG. 6.

The aminolysis of FIGS. 3 and 4, and the oxidation of FIGS. 5 and 6 can be accomplished with any suitable processing. In some aspects, the aminolysis and oxidation are separate ALD steps relative to one another. In other words, the aminolysis of FIGS. 3 and 4 is initially conducted in a reaction chamber, then the nitrogen-containing precursor is purged from within the reaction chamber, and subsequently the oxidation of FIGS. 5 and 6 is conducted. In other aspects, the aminolysis and oxidation can be conducted in a reaction chamber in a common processing step. In such aspect, the nitrogen-containing precursor utilized for the aminolysis will be present in the reaction chamber at the same time as the oxidant utilized for the oxidation. Oxidation will not occur until after aminolysis, so the two species can be co-introduced in such aspects of the invention. In other aspects, the formation of the metal-and-halogen-containing material (or semimetal-and-halogen-containing material) 14 of FIG. 2, formation of the metal-and-nitrogen-containing material (or semimetal-and-nitrogen-containing material) 16 of FIG. 4, and formation of the metal oxide (or semimetal oxide) 18 of FIG. 6 occur in three separate ALD steps.

The processing of FIGS. 1-6 can be repeated through multiple iterations to form a metal-oxide material (or semimetal-oxide material) to a desired thickness. Specifically, the oxygens of the metal-oxide material (or semimetal-oxide material) 18 can be utilized as bonding atoms "A" of the FIG. 1 construction during a subsequent iteration of the process, and accordingly the processing of FIGS. 1-6 can be repeated to form a second metal oxide (or semimetal oxide) over the metal oxide (or semimetal oxide) 18. The second metal oxide (or semimetal oxide) can be the same as the metal oxide (or semimetal oxide) 18, or can differ in, for example, the type of metal and/or semimetal utilized in the second metal oxide (or semimetal oxide).

Figure 7:
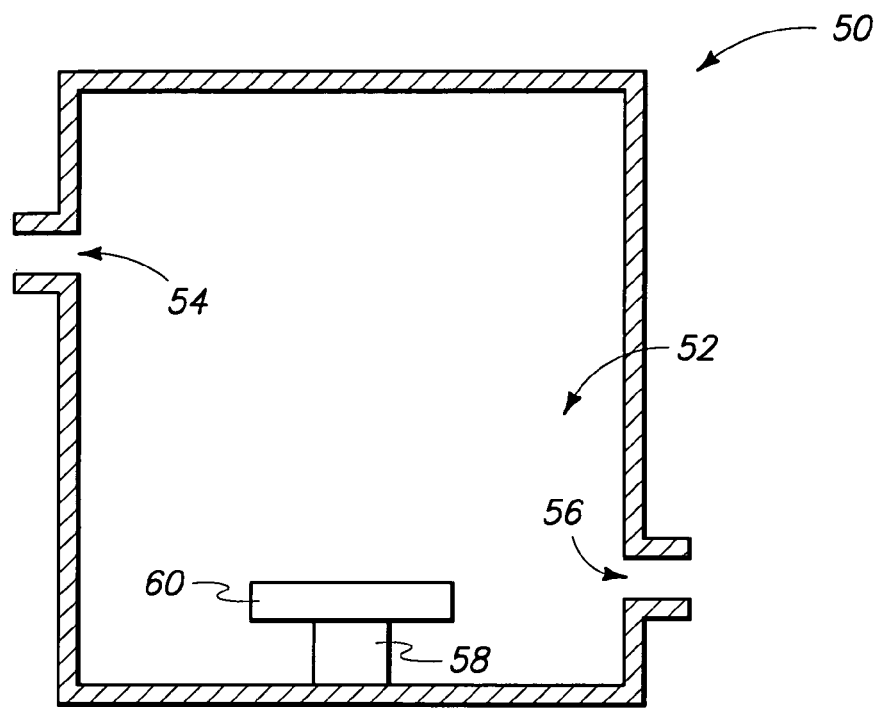
FIG. 7 is diagrammatic, cross-sectional, fragmentary view of an exemplary reaction chamber which can be utilized in some aspects of the present invention.

An exemplary reaction chamber which can be utilized in some aspects of the invention is diagrammatically illustrated in FIG. 7 as part of an apparatus 50. Specifically, the apparatus 50 comprises a chamber 52 having an inlet 54 and an outlet 56 extending therein. Additionally, the apparatus 50 comprises a substrate support 58 within the chamber. The substrate support is shown supporting a substrate 60, which can correspond to, for example, a monocrystalline silicon wafer. Various valves, pumps and other flow-control devices (not shown) would be associated with apparatus 50 for controlling flow of reactants and products into and out of chamber 52. In operation, reactants would be flowed into chamber 52 through inlet 54 and subjected to appropriate conditions to form a desired material over a surface of substrate 60. Excess reactant and various by-products of the reaction would then be exhausted from apparatus 50 through outlet 56. If apparatus 50 is utilized for CVD processes, multiple reactants can be provided simultaneously within chamber 52 and the reactants can react with one another prior to forming a deposited material over a surface of substrate 60. If apparatus 50 is utilized for an ALD process, conditions are typically chosen so that reactants are not in the chamber at the same time, rather than reacting with one another within chamber 52 prior to incorporation into the deposit.

Figure 8:
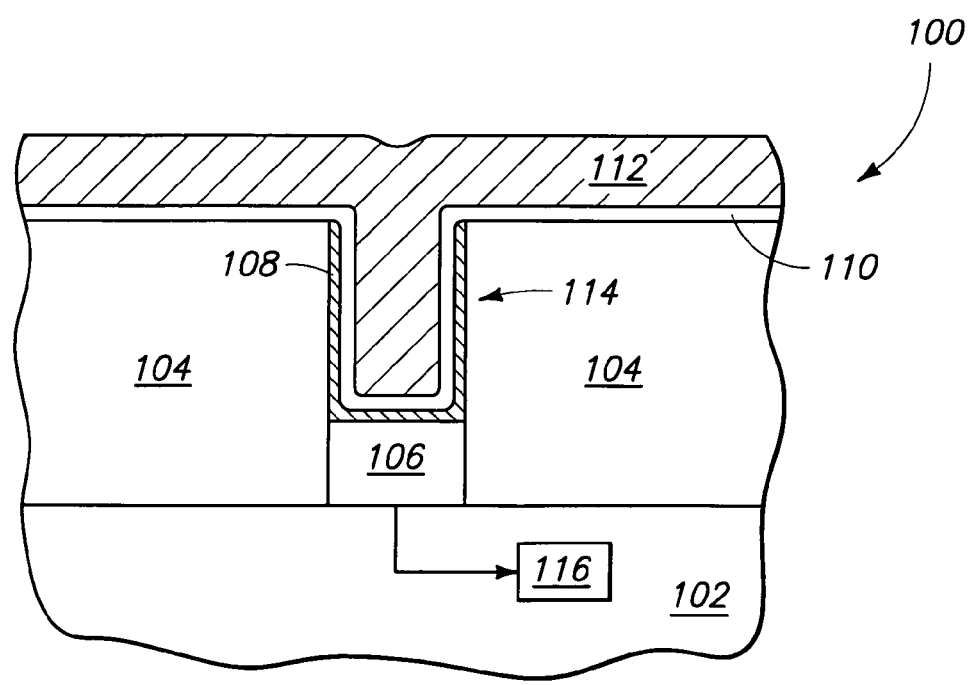
FIG. 8 is a diagrammatic, cross-sectional, fragmentary view of a semiconductor construction illustrating an exemplary capacitor which can be formed in accordance with an aspect of the present invention.

A metal oxide (or semimetal oxide) formed in accordance with the present invention can be utilized for any suitable application. In some aspects, the metal oxide (or semimetal oxide) will be incorporated into a capacitor construction. FIG. 8 illustrates a semiconductor structure 100 comprising an exemplary capacitor construction. The structure 100 is shown to comprise a substrate 102 having a dielectric material 104 thereover. Substrate 102 can correspond to a semiconductor substrate, and can comprise monocrystalline silicon either alone, or in combination with numerous other layers and materials (not shown). Dielectric material 104 can comprise, for example, borophosphosilicate glass, undoped silicon dioxide, and/or silicon nitride.

An electrically conductive pedestal 106 is over substrate 102, and an opening extends through insulative material 104 to an upper surface of pedestal 106. The opening corresponds to a container opening, and a capacitor storage node 108 is formed within such container opening to partially fill the opening. A dielectric material 110 and second capacitor electrode 112 also extend within the opening in the shown aspect of the invention.

Electrodes 108 and 112 can comprise any suitable electrically conductive compositions, or combinations of compositions. For instance, the electrodes can comprise various metals, metal compounds, and/or conductively-doped semiconductor materials.

Dielectric material 110 can comprise, consist essentially of, or consist of a metal oxide and/or semimetal oxide formed in accordance with aspects of the invention discussed previously in this disclosure.

The dielectric material 110 capacitively separates electrodes 108 and 112 from one another, and accordingly the electrodes 108 and 112, together with dielectric material 110, form a capacitor construction 114. Such capacitor construction can be incorporated into any suitable integrated circuit. For instance, capacitor construction 114 can be incorporated into a dynamic random access memory (DRAM) unit cell. In such aspect, pedestal 106 can be electrically connected with a source/drain region of a transistor 116. The capacitor 114 and transistor 116 can be part of a memory cell array.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming an oxide, comprising:
   exposing a semiconductor substrate surface to one or more halogen-containing compounds that comprise metal or semimetal to form a construction comprising a material containing halogen and one or both of metal and semimetal bonded to the substrate surface;
   exposing the construction to reactive nitrogen to replace the halogen of the material with nitrogen and thereby incorporate nitrogen into the material; and
   exposing the material having the nitrogen incorporated therein to an oxidant other than water to displace all of the nitrogen from the material and convert an entirety of the material to an oxide comprising one or both of metal oxide and semimetal oxide.

2. The method of claim 1 wherein the oxidant is selected from the group consisting of $O_2$, $O_3$, $NO_x$, $N_2O$ and mixtures thereof, where x is a number greater than 0.

3. The method of claim 1 wherein the oxidant comprises $N_2O$.

4. The method of claim 1 wherein the one or more halogen-containing compounds are selected from the group consisting of fluorides, bromides, iodides and chlorides of one or more of barium, chromium, germanium, hafnium, molybdenum, niobium, tantalum, titanium, tungsten, silicon, vanadium and zirconium.

5. The method of claim 1 wherein the one or more halogen-containing compounds are selected from the group consisting of barium chloride, chromium chloride, germanium chloride, hafnium chloride, molybdenum chloride, niobium chloride, tantalum chloride, titanium chloride, tungsten chloride, silicon chloride, vanadium chloride and zirconium chloride.

6. The method of claim 1 wherein the one or more halogen-containing compounds consist essentially of one or more of chromium bromide, chromium fluoride, chromium iodide and chromium chloride.

7. The method of claim 1 wherein the one or more halogen-containing compounds consist essentially of one or more of germanium bromide, germanium fluoride, germanium iodide and germanium chloride.

8. The method of claim 1 wherein the one or more Halogen-containing compounds consist essentially of one or more of hafnium bromide, hafnium fluoride, hafnium iodide and hafnium chloride.

9. The method of claim 1 wherein the one or more Halogen-containing compounds consist essentially of one or more of molybdenum bromide, molybdenum fluoride, molybdenum iodide and molybdenum chloride.

10. The method of claim 1 wherein the one or more Halogen-containing compounds consist essentially of one or more of niobium bromide, niobium fluoride, niobium iodide and niobium chloride.

11. The method of claim 1 wherein the one or more Halogen-containing compounds consist essentially of one or more of silicon bromide, silicon fluoride, silicon iodide and silicon chloride.

12. The method of claim 1 wherein the one or more Halogen-containing compounds consist essentially of one or more of tantalum bromide, tantalum fluoride, tantalum iodide and tantalum chloride.

13. The method of claim 1 wherein the one or more Halogen-containing compounds consist essentially of one or more of titanium bromide, titanium fluoride, titanium iodide and titanium chloride.

14. The method of claim 1 wherein the one or more Halogen-containing compounds consist essentially of one or more of tungsten bromide, tungsten fluoride, tungsten iodide and tungsten chloride.

15. The method of claim 1 wherein the one or more Halogen-containing compounds consist essentially of one or more of vanadium bromide, vanadium fluoride, vanadium iodide and vanadium chloride.

16. The method of claim 1 wherein the one or more Halogen-containing compounds consist essentially of one or more of zirconium bromide, zirconium fluoride, zirconium iodide and zirconium chloride.

17. A method of forming an oxide, comprising:
    exposing a semiconductor substrate surface to one or more halogen-containing compounds that comprise metal or semimetal to form a construction comprising a material containing halogen and one or both of metal and semimetal bonded to the substrate surface;
    exposing the construction to reactive nitrogen to replace the halogen of the material with nitrogen and thereby incorporate nitrogen into the material;
    exposing the material having the nitrogen incorporated therein to an oxidant other than water to displace all of the nitrogen from the material and convert an entirety of the material to an oxide comprising one or both of metal oxide and semimetal oxide; and
    wherein the one or more halogen-containing compounds consist essentially of one or more of barium bromide, barium fluoride, barium iodide and barium chloride.

18. A method of forming a capacitor, comprising:
    exposing a first capacitor electrode surface to one or more halogen-containing compounds that comprise metal or semimetal to form a construction comprising a material containing halogen and one or both of metal and semimetal bonded to the first capacitor electrode surface;
    exposing the construction to reactive nitrogen to replace the halogen of the material with nitrogen and thereby incorporate nitrogen into the material;
    exposing the material having the nitrogen incorporated therein to an oxidant other than water to displace all of the nitrogen from the material and convert an entirety of the material to an oxide comprising one or both of metal oxide and semimetal oxide; and forming a second capacitor electrode over the oxide.

19. A method of forming an oxide, comprising:

providing a semiconductor substrate having a surface comprising bonding atoms, the bonding atoms being one or both of oxygen and nitrogen; and performing at least one iteration of the following sequence:

exposing the bonding atoms to one or more halogen-containing compounds comprising metal or semimetal, the exposing of the bonding atoms to the one or more halogen-containing compounds forming a construction comprising at least one halogen-containing composition bonded to the substrate through the bonding atoms, the at least one halogen-containing composition comprising one or both of metal and semimetal;

exposing the construction to reactive nitrogen to replace the halogen of the composition with the nitrogen and thereby convert the composition to a nitrogen-containing material; and exposing the nitrogen-containing material to an oxidant other than water to displace all of the nitrogen from the nitrogen-containing material and thereby convert the nitrogen-containing material to one or both of metal oxide and semimetal oxide; wherein the oxygen of the oxide becomes bonding atoms for a subsequent iteration of the sequence.

20. The method of claim 19 comprising at least two iterations of the sequence.

21. The method of claim 19 wherein the steps within at least one iteration of: (1) exposure to one or more halogen-containing compounds, (2) exposure to reactive nitrogen, and (3) exposure to oxidant are three separate ALD steps.

22. The method of claim 19 wherein the steps within each iteration of: (1) exposure to one or more halogen-containing compounds, (2) exposure to reactive nitrogen, and (3) exposure to oxidant are three separate ALD steps.

23. The method of claim 19 wherein the exposure to reactive nitrogen and exposure to oxidant within each iteration occur in a common processing step.

24. The method of claim 19 wherein the oxidant is selected from the group consisting of $O_2$, $O_3$, $NO_x$, $N_2O$ and mixtures thereof, where x is a number greater than 0.

25. A method of forming a capacitor, comprising:

providing a capacitor electrode surface comprising bonding atoms, the bonding atoms being one or both of oxygen and nitrogen;

performing at least one iteration of the following sequence:

exposing the bonding atoms to one or more halogen-containing compounds comprising metal or semimetal, the exposing of the bonding atoms to the one or more halogen-containing compounds forming a construction comprising at least one halogen-containing composition bonded to the substrate through the bonding atoms, the at least one halogen-containing composition comprising one or both of metal and semimetal;

exposing the construction to reactive nitrogen to replace the halogen of the composition with the nitrogen and thereby convert the composition to a nitrogen-containing material; and exposing the nitrogen-containing material to an oxidant other than water to displace all of the nitrogen from the nitrogen-containing material and thereby convert the nitrogen-containing material to capacitor dielectric consisting of one or both of metal oxide and semimetal oxide; wherein the oxygen of the oxide becomes bonding atoms for a subsequent iteration of the sequence; and after performing said at least one iteration, forming a second capacitor electrode over the capacitor dielectric.

* * * * *